United States Patent
Gambino et al.

(10) Patent No.: US 7,232,711 B2
(45) Date of Patent: Jun. 19, 2007

(54) METHOD AND STRUCTURE TO PREVENT CIRCUIT NETWORK CHARGING DURING FABRICATION OF INTEGRATED CIRCUITS

(75) Inventors: Jeffrey P. Gambino, Westford, VT (US); Kirk D. Peterson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/908,720

(22) Filed: May 24, 2005

(65) Prior Publication Data

US 2006/0267137 A1  Nov. 30, 2006

(51) Int. Cl.
  *H01L 21/82*  (2006.01)
  *H01L 21/326*  (2006.01)
  *H01L 21/479*  (2006.01)
(52) U.S. Cl. .................. 438/132; 438/467; 438/601
(58) Field of Classification Search ............... 438/131, 438/132, 215, 281, 467, 601, FOR. 433
  See application file for complete search history.

(56) References Cited

U.S. PATENT DOCUMENTS

| | | | |
|---|---|---|---|
| 6,753,204 B1 | 6/2004 | Mayer | |
| 2001/0010964 A1 | 8/2001 | Geissler et al. | |
| 2004/0041168 A1 | 3/2004 | Hembree et al. | |
| 2005/0029598 A1* | 2/2005 | Marr et al. | 257/355 |
| 2005/0029622 A1* | 2/2005 | Marr et al. | 257/530 |
| 2005/0181546 A1* | 8/2005 | Madurawe | 438/132 |
| 2005/0280083 A1* | 12/2005 | Vogelsang | 257/338 |
| 2006/0097345 A1* | 5/2006 | Marr | 257/530 |
| 2006/0121650 A1* | 6/2006 | Fogal et al. | 438/128 |
| 2006/0189082 A1* | 8/2006 | Vogelsang | 438/270 |

* cited by examiner

*Primary Examiner*—Ngân V. Ngô
(74) *Attorney, Agent, or Firm*—Schmeiser, Olsen & Watts; William D. Sabo

(57) ABSTRACT

An integrated circuit and method of fabricating the integrated circuit. The integrated circuit, including: one or more power distribution networks; one or more ground distribution networks; one or more data networks; and fuses temporarily and electrically connecting power, ground or data wires of the same or different networks together, the same or different networks selected from the group consisting of the one or more power distribution networks, the one or more ground distribution networks, the one or more data networks, and combinations thereof.

20 Claims, 9 Drawing Sheets

US 7,232,711 B2

METHOD AND STRUCTURE TO PREVENT CIRCUIT NETWORK CHARGING DURING FABRICATION OF INTEGRATED CIRCUITS

FIELD OF THE INVENTION

The present invention relates to the field of integrated circuit manufacture; more specifically, it relates to a method and structure for prevent circuit network charging during fabrication of integrated circuits.

BACKGROUND OF THE INVENTION

As the size (surface area) of integrated circuits has increased and as the number of devices it is possible to form per unit area has increased, it has become possible to incorporate ever-larger circuit networks within integrated circuit chips, which require ever more protection from charge induced defects. Conventional charge protection schemes, such as the incorporation of electrostatic discharge (ESD) protection circuits are directed to protection of the integrated circuit chip after fabrication is complete, but not while the integrated circuit is being fabricated. Therefore, there is a need for new and improved methods and structures to prevent charge induced yield loss during fabrication of integrated circuit chips.

SUMMARY OF THE INVENTION

A first aspect of the present invention is an integrated circuit, comprising: one or more power distribution networks; one or more ground distribution networks; one or more data networks; and fuses temporarily and electrically connecting power, ground or data wires of the same or different networks together, the same or different networks selected from the group consisting of the one or more power distribution networks, the one or more ground distribution networks, the one or more data networks, and combinations thereof.

A second aspect of the present invention is a method of fabricating an integrated circuit, comprising: forming one or more power distribution networks; forming one or more ground distribution networks; forming one or more data networks; and temporarily and electrically connecting power, ground or data wires of the same or different networks together with fuses, the same or different networks selected from the group consisting of the one or more power distribution networks, the one or more ground distribution networks, the one or more data networks, and combinations thereof.

A third aspect of the present invention is a method of fabricating an integrated circuit, comprising: forming one or more power distribution networks, the one or more power distribution networks including wires formed in a multiplicity of wiring levels; forming one or more ground distribution networks, the one or more ground distribution networks including wires formed in a multiplicity of wiring levels; forming one or more data networks, the one or more data networks including wires formed in a multiplicity of wiring levels; and temporarily electrically connecting power, ground or data wires of the same or different networks together in one or more of the three wiring levels closest to the semiconductor substrate, the same or different networks selected from the group consisting of the one or more power distribution networks, the one or more ground distribution networks, the one or more data networks and combinations thereof.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Wiring levels of integrated circuits are generally numbered from the lowest wiring level (that closest to a semiconductor substrate) to the highest wiring level (that furthest away from the semiconductor substrate). In one example, the contact level is designated M0 (for metal 0), wiring levels are designated M1 (for first metal), M2 . . . LM-2, LM-1, LM (for last metal). Level M0 is used primarily for forming contacts to the gates and source/drains of NFETs and PFETs and for otherwise contacting the semiconductor substrate. Level TM is used primarily for forming I/O and power and ground pads. Thus the progression of interconnect levels may be designated M0, M1, M2 . . . LM-2, LM-1, LM and TM, with wiring level M1 being closest to the semiconductor substrate and wiring level LM being the farthest away.

Integrated circuits are generally formed from devices, such as N-channel field effect transistors (NFETs) and P-channel field effect transistors (PFETs) formed in a substrate, the data paths of which are connected by conductive wires formed in the wiring levels described supra. The data paths become successively more complex in each successive wiring level from the lowest wiring level to the highest wiring level. By contrast, power and ground distribution networks are at their least complex in the highest wiring levels and become more complex in the lowest wiring levels as the power and ground must be distributed to the various circuits and devices.

The inventors have found that this data and power wiring design leads to serious yield loss during fabrication of integrated circuits because the power and ground distribution networks fully interconnect the various circuits only after the higher wiring levels have been fabricated. The inventors have found that plasma processes used during fabrication of integrated circuits, such as reactive ion etching (RIE), plasma depositions, plasma stripping and others, can induce charge into the gates of FETs and the dielectric layers in which wires are embedded, with the wires acting as antennas. Without a completed ground or power distribution network, this charge is not easily dissipated. If sufficiently large enough voltage differences are produced the voltage can be discharged across the gates of transistors in the same or different data networks.

Devices on silicon-on-insulator (SOI) substrates are particularly vulnerable to this failure mechanism because the transistor bodies tend to be isolated and there is no "substrate" ground. However, the failure mechanism is expected to also occur in bulk silicon wafers where a combination of trench isolation (TI) and diffused isolation are used. Additionally, integrated circuit chips having data networks supplied from different power sources (a concept known as partitioning the integrated circuit into voltage islands) has been shown to be particularly vulnerable to this failure mechanism as well.

Figure 1:
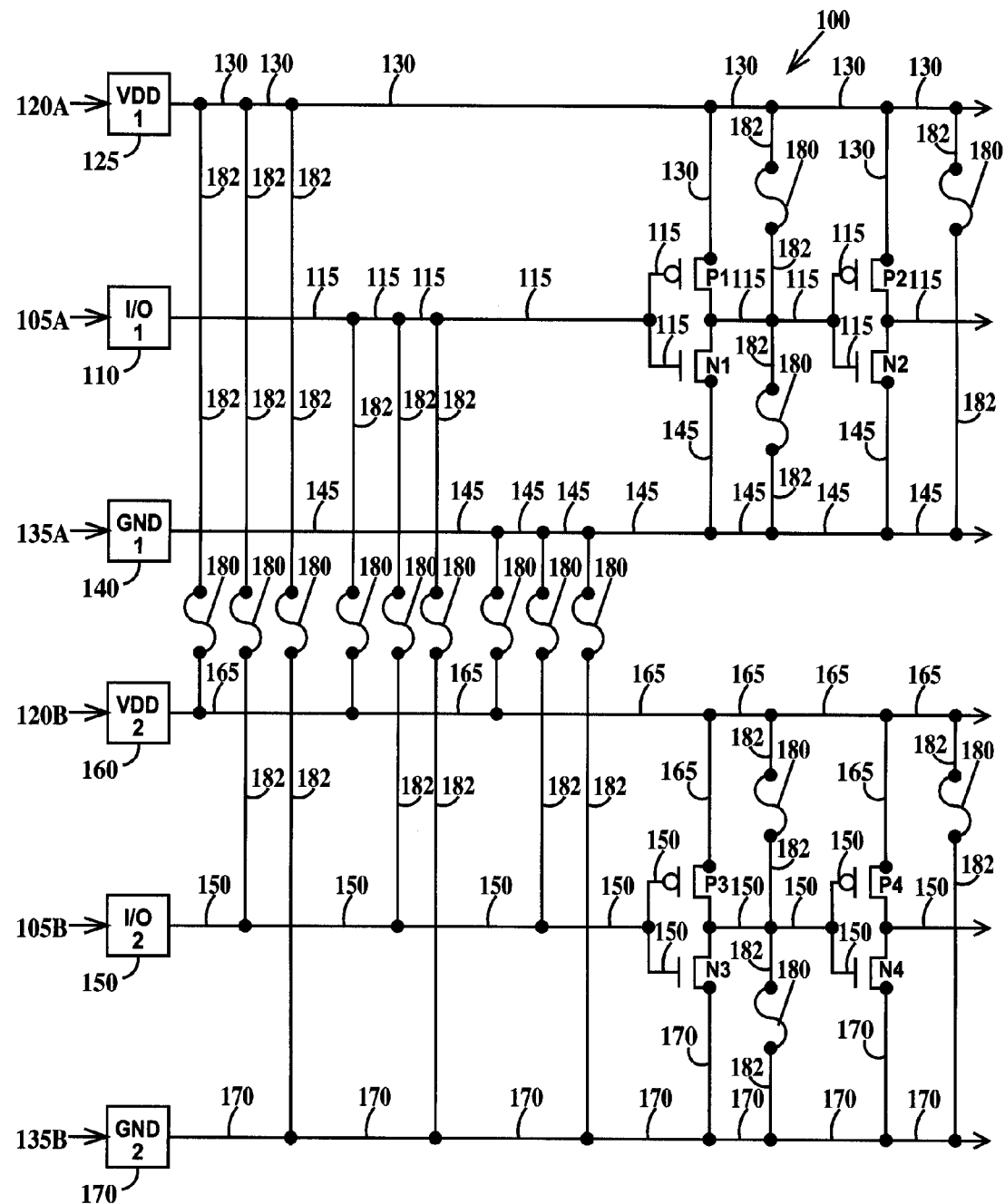
FIG. 1 is a schematic circuit diagram of a portion of an exemplary integrated circuit according to the present invention.

FIG. 1 is a schematic circuit diagram of a portion of an exemplary integrated circuit according to the present invention. In FIG. 1, integrated circuit 100 includes a first data network 105A comprising PFETs P1 and P2, NFETs N1 and N2, and I/O pad 110 connected by wires 115 which form the data path of first data network 105A. A first power distribution network 120A comprising a VDD1 pad 125 and wires 130 supplies power and a first ground distribution network 135A comprising a GND1 pad 140 and wires 145 supplies ground to first data network 105. Integrated circuit 100 also includes a second data network 105B comprising PFETs P3 and P4, NFETs N3 and N4, and I/O pad 150 connected by wires 155 which form the data path of second data network 105B. A second power distribution network 120B comprising a VDD2 pad 160 and wires 165 supplies power and a second ground distribution network 135B comprising a GND2 pad 170 and wires 175 supplies ground to second data network 105B.

Integrated circuit 100 further includes a multiplicity of fuses 180. Wires 182 allow fuses 180 to electrically connect first power distribution network 120A to second power distribution network 120B, to second data network 105B and to second ground distribution network 135B. Wires 182 allow fuses 180 to electrically connect first data network 105A to second power distribution network 120B, to second data network 105B and to second ground distribution network 135B. Wires 182 allow fuses 180 to electrically connect first ground distribution network 135A to second power distribution network 120B, to second data network 105B and to second ground distribution network 135B. Wires 182 allow fuses 180 to electrically connect first data network 105A to first power distribution network 105A and to first ground distribution network 135A. Wires 182 allow fuses 180 to electrically connect first power distribution network 105A to first ground distribution network 135A. Wires 182 allow fuses 180 to electrically connect second data network 105BA to second power distribution network 105B and to second ground distribution network 135BA. Wires 182 allow fuses 180 to electrically connect second power distribution network 105B to second ground distribution network 135B.

As illustrated in FIG. 1, many combinations of different networks can be connected by fuses according to the present invention, examples of which include, inter and intra data network connections, data network to power distribution network connections, data network to ground distribution network connections, power distribution network to power distribution network connections, ground distribution network to ground distribution network connections, power distribution network to ground distribution network connections and combinations thereof.

Power and ground distribution network wires carry only power or ground signals. Data network wires carry only data signals. Any permanent direct wire to wire connection between power and ground distribution network wires will render an integrated circuit non-functional. Any permanent direct wire to wire connection between power or ground distribution network wires and data network wires will render an integrated circuit non-functional. The use of fuses to make direct wire to wire connections allows the connections to be changed from a conductive or low resistance state to an open or high resistance state after fabrication of the integrated circuit is completed. An open or high resistance state is defined as a state in which the resistance of the fuse is high enough such that none to an insignificant amount of current can flow across the fuse, an insignificant amount of current being defined as an amount of current that does not adversely effect the normal operation of the integrated circuit. However, as illustrated in FIG. 1, connection between power and ground distribution networks through FETs and connection between power or ground distribution networks and data networks through FETs is normal.

Figure 2:
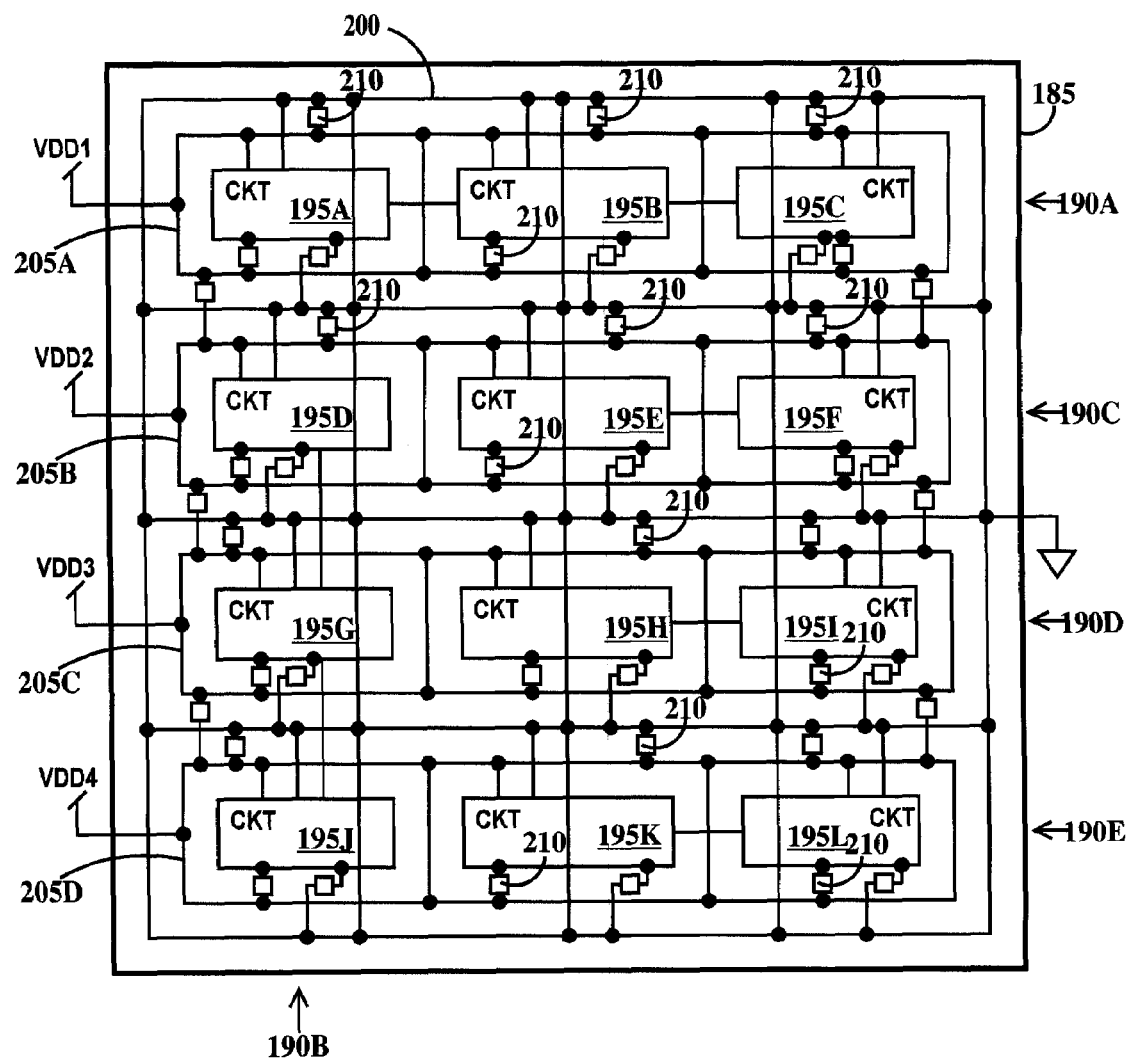
FIG. 2 is a schematic circuit diagram of a completed integrated circuit chip; according to a first embodiment the present invention.

FIG. 2 is a schematic circuit diagram of a completed integrated circuit chip; according to a first embodiment of the present invention. In FIG. 2, an integrated circuit chip 185 includes a first circuit network 190A that includes circuits 195A, 195B and 195C, a second circuit network 190B that includes circuits 195D, 195G and 195J, a third circuit network that includes circuits 195E and 195F, a fourth circuit network 190D that includes circuits 195H and 195I and a fifth circuit network 190E that includes circuits 195K and 195L. Integrated circuit chip 185 also includes a ground distribution network 200, a VDD1 power distribution network 205A, a VDD2 power distribution network 205B, a VDD3 power distribution network 205C and a VDD4 power distribution network 205D. Circuit network 190A is connected to VDD1 power distribution network 205A and ground distribution network 200. Circuit network 190B is connected to VDD2 power distribution network 205B, VDD3 power distribution network 205C, VDD4 power distribution network 205D and ground distribution network 200. Circuit network 190C is connected to VDD2 power distribution network 205B and ground distribution network 200. Circuit network 190D is connected to VDD3 power distribution network 205C and ground distribution network 200. Circuit network 190E is connected to VDD4 power distribution network 205D and ground distribution network 200.

Fuses 210 are placed to electrically connect wires of circuits 195A, 195B and 195C and VDD1 power distribution network 205A and to electrically connect wires of circuits 195A, 195B and 195C and ground distribution network 200. Fuses 210 are placed to temporarily electrically connect wires of circuits 195D, 195E and 195F and VDD2 power distribution network 205B and to temporarily electrically connect wires of circuits 195D, 195E and 195F and ground distribution network 200. Fuses 210 are placed to temporarily electrically connect wires of circuits 195G, 195H and 195I and VDD3 power distribution network 205C and to temporarily electrically connect wires of circuits 195G, 195H and 195I and ground distribution network 200. Fuses 210 are placed to temporarily electrically connect wires of circuits 195J, 195K and 195L and VDD4 power distribution network 205D and to temporarily electrically connect wires of circuits 195J, 195K and 195L and ground distribution network 200. Fuses 210 are also placed to temporarily electrically connect VDD1 power distribution network 205A, VDD2 power distribution network 205B, VDD3 power distribution network 205C and VDD4 power distribution network 205D to ground distribution network 200. Fuses 210 are also placed to temporarily electrically connect VDD1 power distribution network 205A, VDD2 power distribution network 205B, VDD3 power distribution network 205C and VDD4 power distribution network 205D to each other.

When connections to fuses 210 are made at wiring level M1, circuits 195A, 195B, 195C, 195D, 195E, 205F, 195G, 195H, 205I, 195J, 205K and 195L, power distribution networks 205A, 205B, 205C and 195D and ground distribution network 200 are tied together, effectively eliminating the opportunity for differences in voltage potential to occur amongst the different circuits as fabrication of integrated circuit chip 185 progresses. Fuse connections may be made at higher wiring levels than wiring level M1 (for example, at one or more of the three wiring levels closest to the semiconductor substrate), but with decreasing effectiveness against the defect mechanism. After fabrication is complete, the fuses are "blown" so as to electrically break all the fuse connections between circuits 195A, 195B, 195C, 195D, 195E, 205F, 195G, 195H, 205I, 195J, 205K and 195L, power distribution networks 205A, 205B, 205C and 195D and ground distribution network 200. Fuse blowing is also called fuse programming and a fuse that has been "blown" may be said to have been programmed. Examples of fuse type suitable for use as fuses 210 include metal silicide/polysilicon fuses and metal fuses formed in wiring level M1 and both types are described infra. Other types of fuses may be used as well.

In the first embodiment of the present invention, the various data network, power distribution network and ground distribution network shorting fuses 210 are placed in positions of opportunity selectable by a designer during the design process.

Figure 3A:
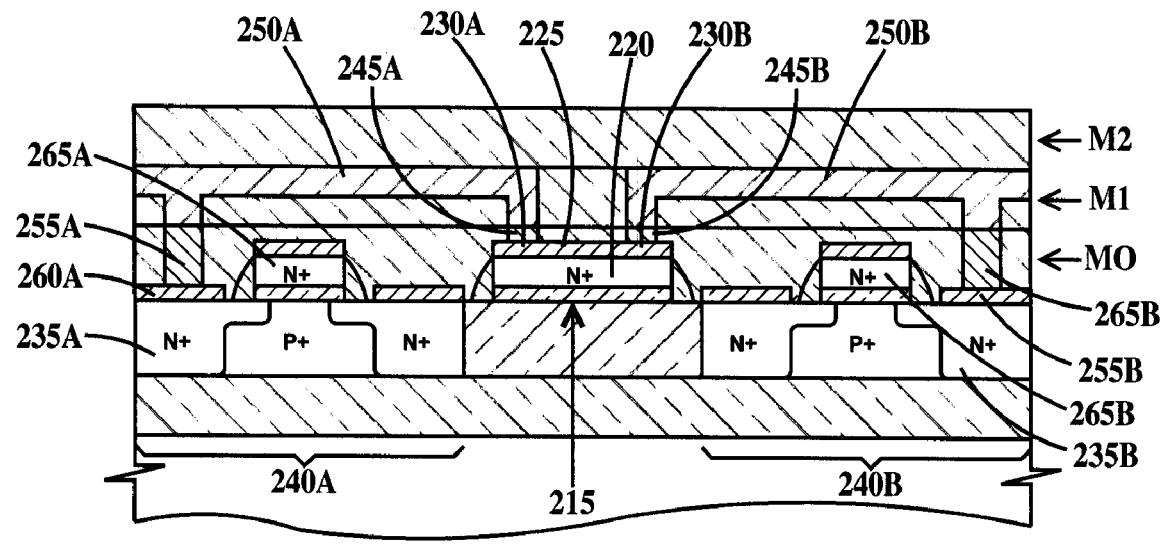
FIG. 3A is a cross-sectional view of an integrated circuit chip during fabrication and FIG. 3B after fabrication and e-fuse blow utilizing silicide/polysilicon fuses according to the present invention.
Figure 3B:
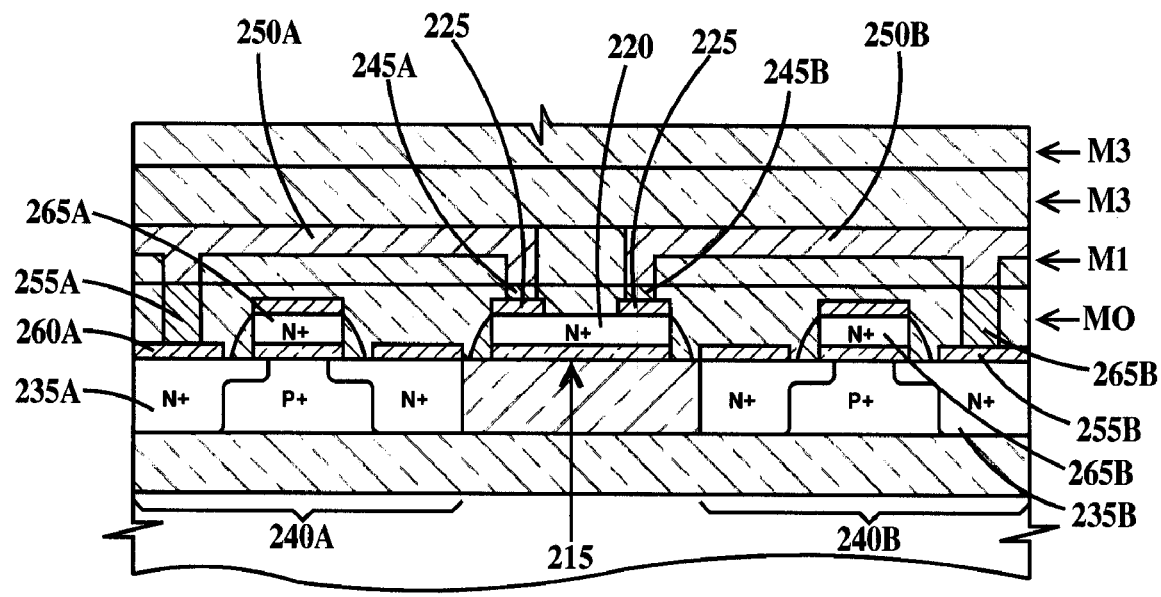

FIG. 3A is a cross-sectional view of an integrated circuit chip during fabrication and FIG. 3B after fabrication and electronic-fuse (e-fuse) blow utilizing silicide/polysilicon fuses according to the present invention. In FIG. 3A, a fuse 215 includes a doped polysilicon layer 220 and a metal silicide layer 225. A first end 230A of silicide layer 210 of fuse 200 is connected to a source/drain 235A of a first NFET 240A through conductive stud 245A, a first wiring level M1 metal line 250A, a conductive stud 255A and metal silicide contact 260A and a second end 230B of silicide layer 210 of fuse 200 is connected to a source/drain 235B of a first NFET 240B through conductive stud 245B, a second wiring level M1 metal line 250B, a conductive stud 255B and metal silicide contact 260B. Fuse 215 may be connected between source/drain 235A of first NFET 240A and a source/drain 235B of a second NFET 240B. Fuse 200 is formed on top of an STI 265 that contacts a BOX 270.

In FIG. 3B, fuse 215 has been programmed (i.e. a metal silicide layer 225 is no longer intact and is not connecting source/drains 235A and 235B together) by applying a voltage differential across the fuse and passing a current through it, such that only polysilicon layer or a portion of polysilicon is providing an electrical path between first source/drains 235A and 235B. In a first example, the resistance of fuse 200 before programming is in FIG. 3A is about 195 ohms and the resistance of fuse 215 in FIG. 3A after programming is about 1 Megohm. In a second example, the resistance of fuse 200 before programming is in FIG. 3A is about 10 ohms and the resistance of fuse 215 in FIG. 3A after programming is about 5000 ohms. The exact change of resistance depends on physical structure of the fuse and the electronics of the device used to program the fuse.

Examples of metal suicides include cobalt silicide, nickel silicide and titanium silicide. In one example, metal silicide layer 225 is about 100 to about 1000 angstroms thick and polysilicon layer 220 is about 500 to about 2500 angstroms thick. In a first example, fuse 225 is about 0.5 microns long (in the plane of the paper) and about 0.05 microns wide (perpendicular to the plane of the paper). In a second example, the width of fuse 225 is a small as can be fabricated by the technology used to form the level in which fuse 225 is contained.

Figure 4A:
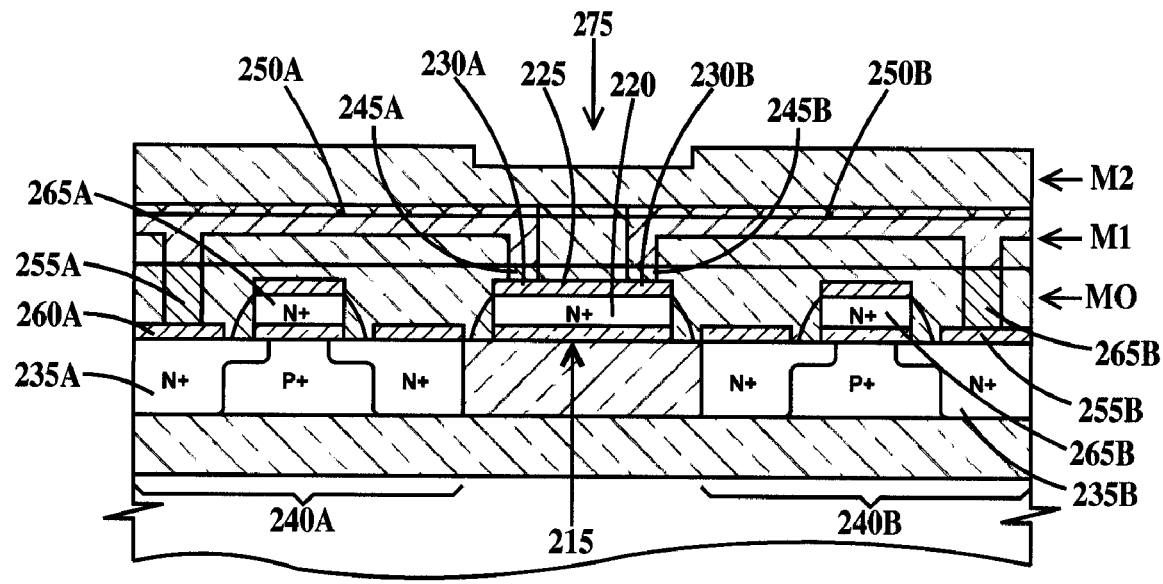
FIG. 4A is a cross-sectional view of an integrated circuit chip during fabrication and FIG. 4B after fabrication and laser fuse blow utilizing silicide/polysilicon fuses according to the present invention.
Figure 4B:
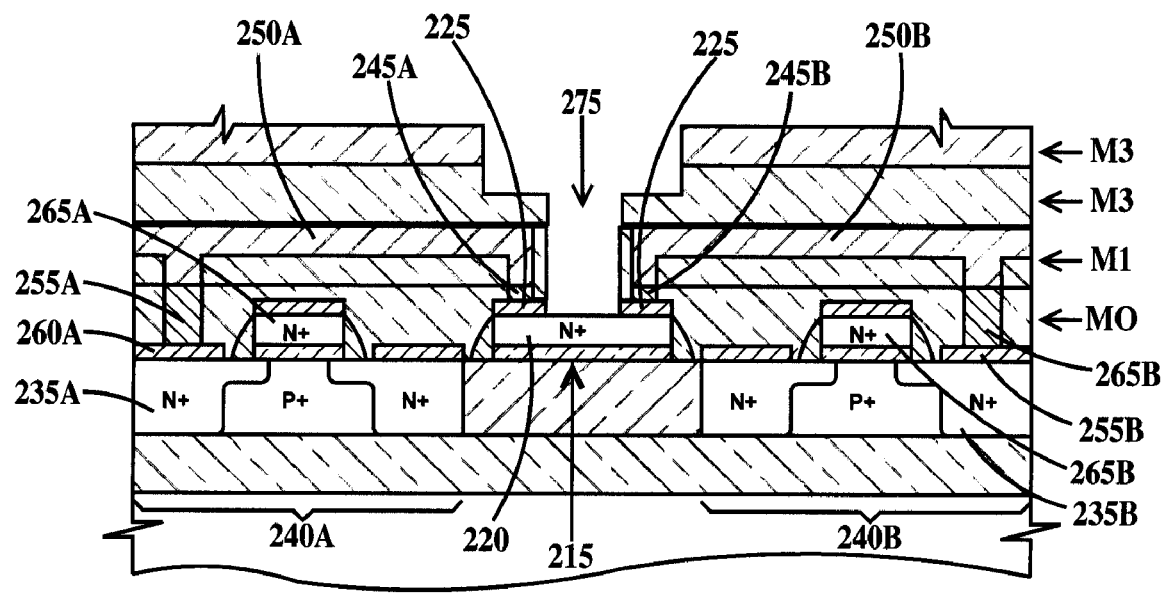

FIG. 4A is a cross-sectional view of an integrated circuit chip during fabrication and FIG. 4B after fabrication and laser fuse blow utilizing silicide/polysilicon fuses according to the present invention. The only difference between FIG. 4A and FIG. 3A is a trench 275 is formed though all layers above wiring level M2 and into the dielectric of wiring level M2 during fabrication. The only difference in FIG. 4B from FIG. 3B is trench 275 is extended through the dielectric of all wiring levels above wiring level M2 during fabrication and through wiring levels M0 and M1 when fuse 215 is programmed. During programming a portion of metal silicide layer 225 is removed and portion of polysilicon layer 220 may be removed by one or more laser pulses.

Figure 5A:
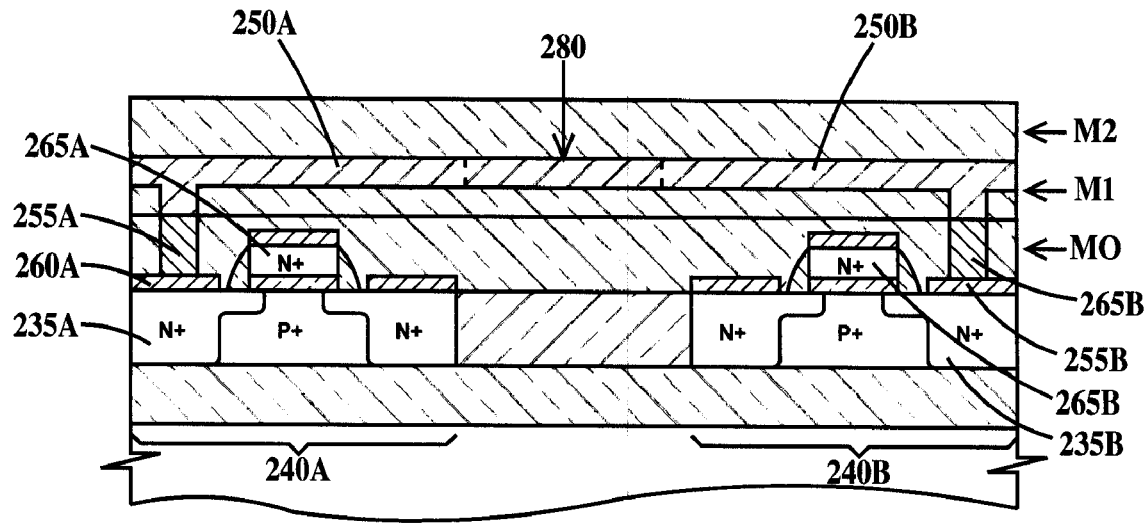
FIG. 5A is a cross-sectional view of an integrated circuit chip during fabrication and FIG. 5B after fabrication and e-fuse blow utilizing first level metal fuses according to the present invention.
Figure 5B:
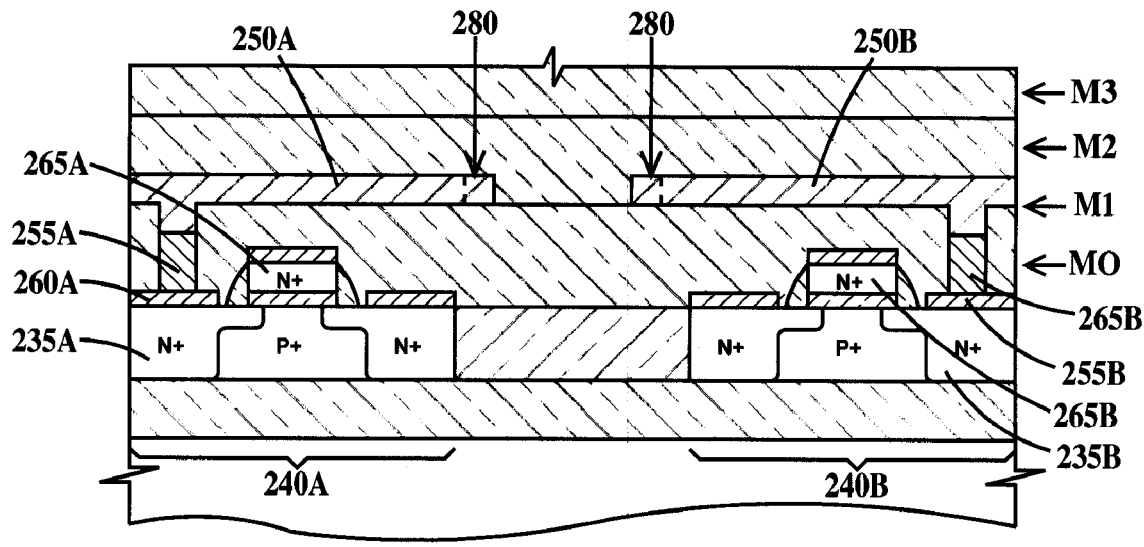
FIG. 5C is a top view of the fuse of FIG. 5A.

FIG. 5A is a cross-sectional view of an integrated circuit chip during fabrication and FIG. 5B after fabrication and e-fuse blow utilizing first level metal fuses according to the present invention. In FIG. 5A, a fuse 280 is integrally formed with a first wiring level M1 metal line 250A and a second wiring level M1 metal line 250B (see FIG. 5C). First wiring level M1 metal line 250A is connected to source/drain 235A of a first NFET 240B through conductive stud 260A and metal silicide contact 260A. Fuse 280 may be connected between gate 265A of first NFET 240A and gate 265B of second NFET 240B instead of to respective source/drains 235A and 235B.

In FIG. 5B, fuse 280 has been programmed, i.e. a portion of fuse 280 is evaporated by passing a current through it, such that first wiring level M1 metal line 250A is no longer connected to second wiring level M1 metal line 250B.

Fuse 280 may be fabricated from, for example, a layer of titanium, titanium nitride, tantalum, tantalum nitride, tungsten or tungsten nitride between about 195 angstroms and about 500 angstroms thick or a layer of copper or aluminum/copper between about 1 micron and 2 microns thick or combinations thereof.

Figure 5C:
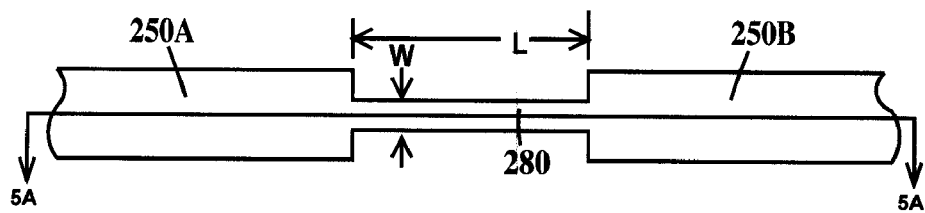

FIG. 5C is a top view of fuse 280 of FIG. 5A. Fuse 280 has a length L and a width W. In a first example, L is about 2 microns and W is between about 0.05 and about 2 microns. In a second example, W is a small as can be fabricated by the technology used to form the level in which fuse 280 is contained.

Figure 6A:
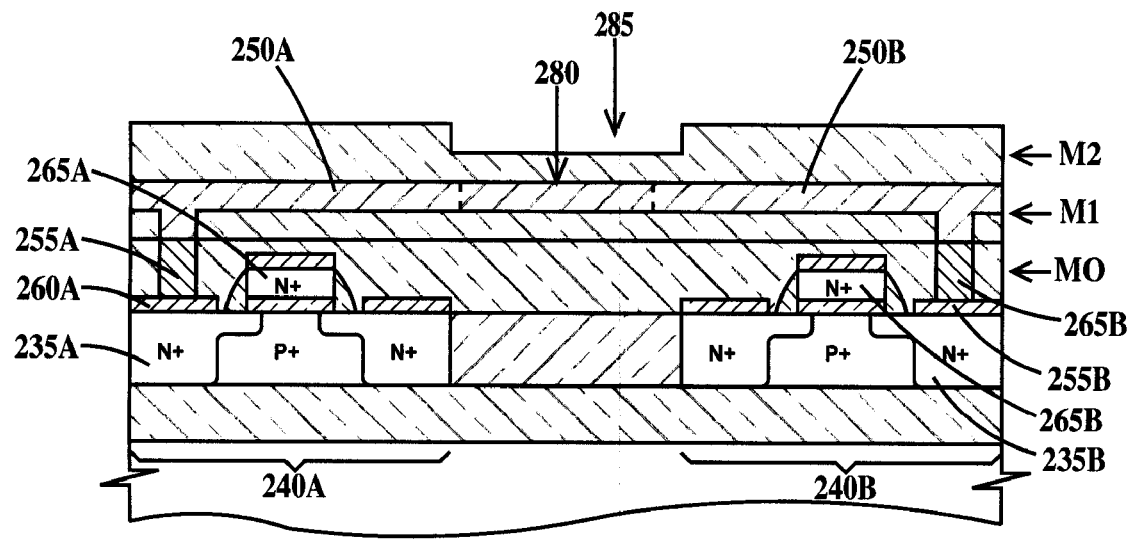
FIG. 6A is a cross-sectional view of an integrated circuit chip during fabrication and FIG. 6B after fabrication and laser fuse blow utilizing first level metal n fuses according to the present invention.
Figure 6B:
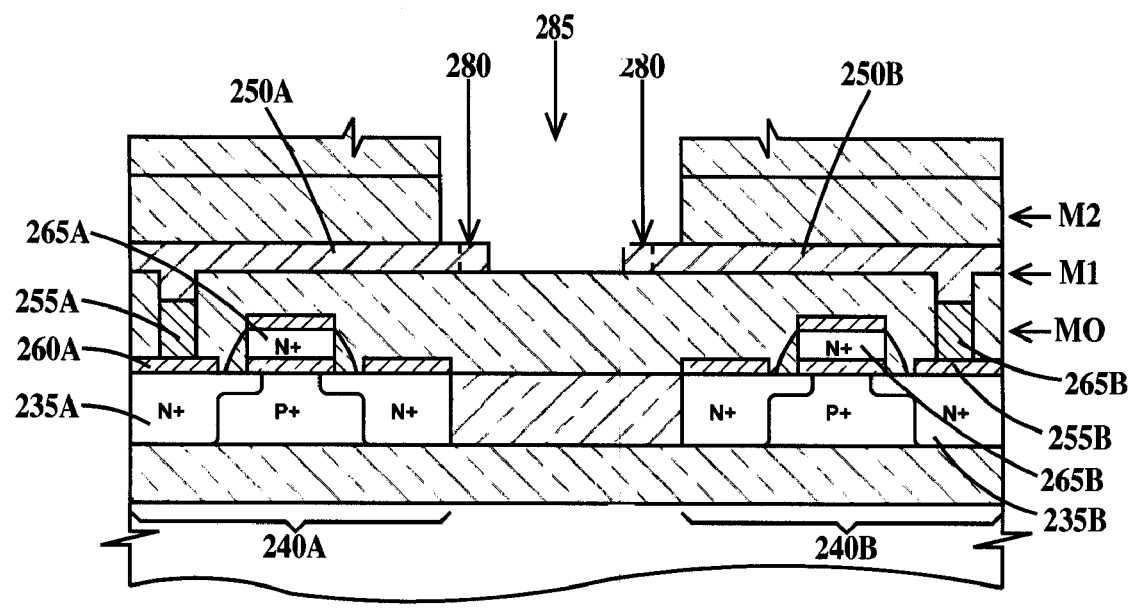

FIG. 6A is a cross-sectional view of an integrated circuit chip during fabrication and FIG. 6B after fabrication and laser fuse blow utilizing first level metal fuses according to the present invention. The only difference between FIG. 6A and FIG. 5A is a trench 285 is formed though all layers above wiring level M2 and into the dielectric of wiring level M2 during fabrication. The only difference in FIG. 6B from FIG. 5B is trench 285 is extended through the dielectric of all layers above the wiring level M2 during fabrication and through wiring levels M0 and M1 when fuse 280 is programmed. During programming a portion fuse 280 is removed by one or more laser pulses.

Laser fuse blow is well known in the art and requires stepping an integrated chip under a laser so each fuse in turn is aligned to the laser beam and pulsing the laser one or more times to heat up the fuse hot enough and fast enough to evaporate explosively. An e-fuse is programmed either by heating the fuse by passing a current through the fuse or by causing electromigration. The method of e-fuse programming may be selected to be compatible with conventional e-fuse programming for other purposes, such as redundancy implementation and setting operating parameters (e.g. operating frequency) of the integrated circuit.

Figure 7:
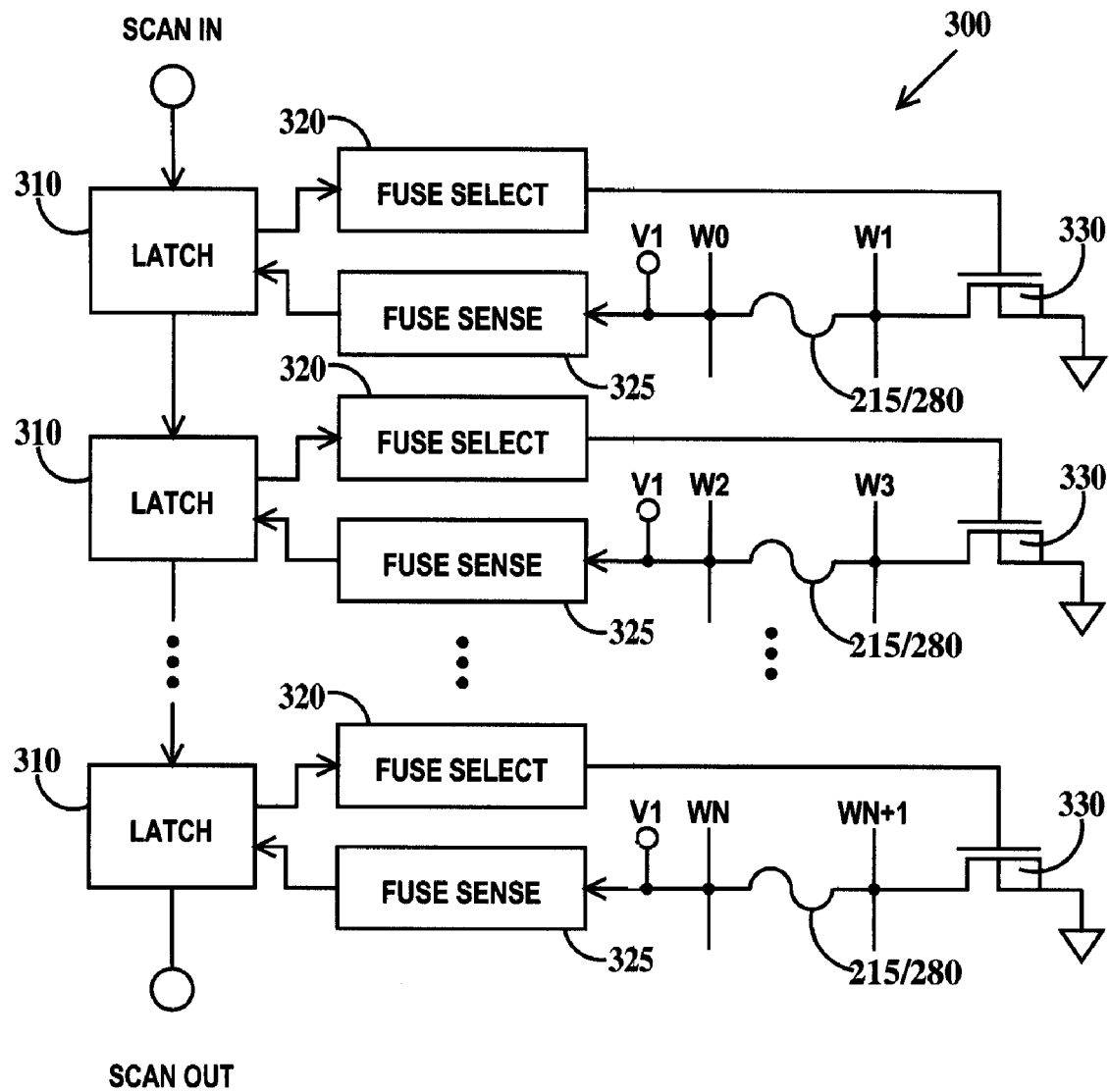
FIG. 7 is an exemplary schematic diagram of a circuit for programming e-fuses of the present invention.

FIG. 7 is an exemplary schematic diagram of a circuit for programming e-fuses of the present invention. In FIG. 7, an e-fuse programming circuit 300, includes a series of latches 305 arranged in series between a scan in pin 310 and a scan out pin 315. Each latch 305 is connected to an input of a respective fuse select circuit 320 and an output of a respective fuse sense circuit 325. An output of each fuse select circuit 320 is connected to a gate of a respective NFET 330. An input of each fuse sense circuit 325 is connected to a respective first node. Fuses 215 or 280 are directly connected between respective first nodes 330 and respective second nodes 335. The drains of each NFET 330 are connected to respective second nodes 335 and the sources of each NFET 330 are connected to ground (or another voltage source). Each first node 330 is connected to a first wiring level M1 wire and each second node 335 is connected to a second and different wiring level M1 wire. However, different fuses 215 or 280 may be connected to the same wiring level M1 wire. Each first node 330 is connected to a programming bias V1 that is turned on only when fuses are to be programmed.

In operation, data is loaded into latches 305 and passed to fuse select circuits which turn on corresponding NFETs 330 for fuses 215 or 280 that are to be blown and applying programming bias V1 across the fuses. Fuse sense circuits 325 may be used verify that the fuses 215 or 280 have been blown and in the case of redundancy fuses and the like, used to transmit data to redundancy select circuits.

Since it is not a requirement that an e-fuse be blown using a VDD to ground potential, alternatively circuits similar to e-fuse programming circuit 300 may be designed by one skilled in the art to apply a voltage difference between two different voltage potentials V1 and V2 where V1>V2 or V2>V1.

Figure 8:
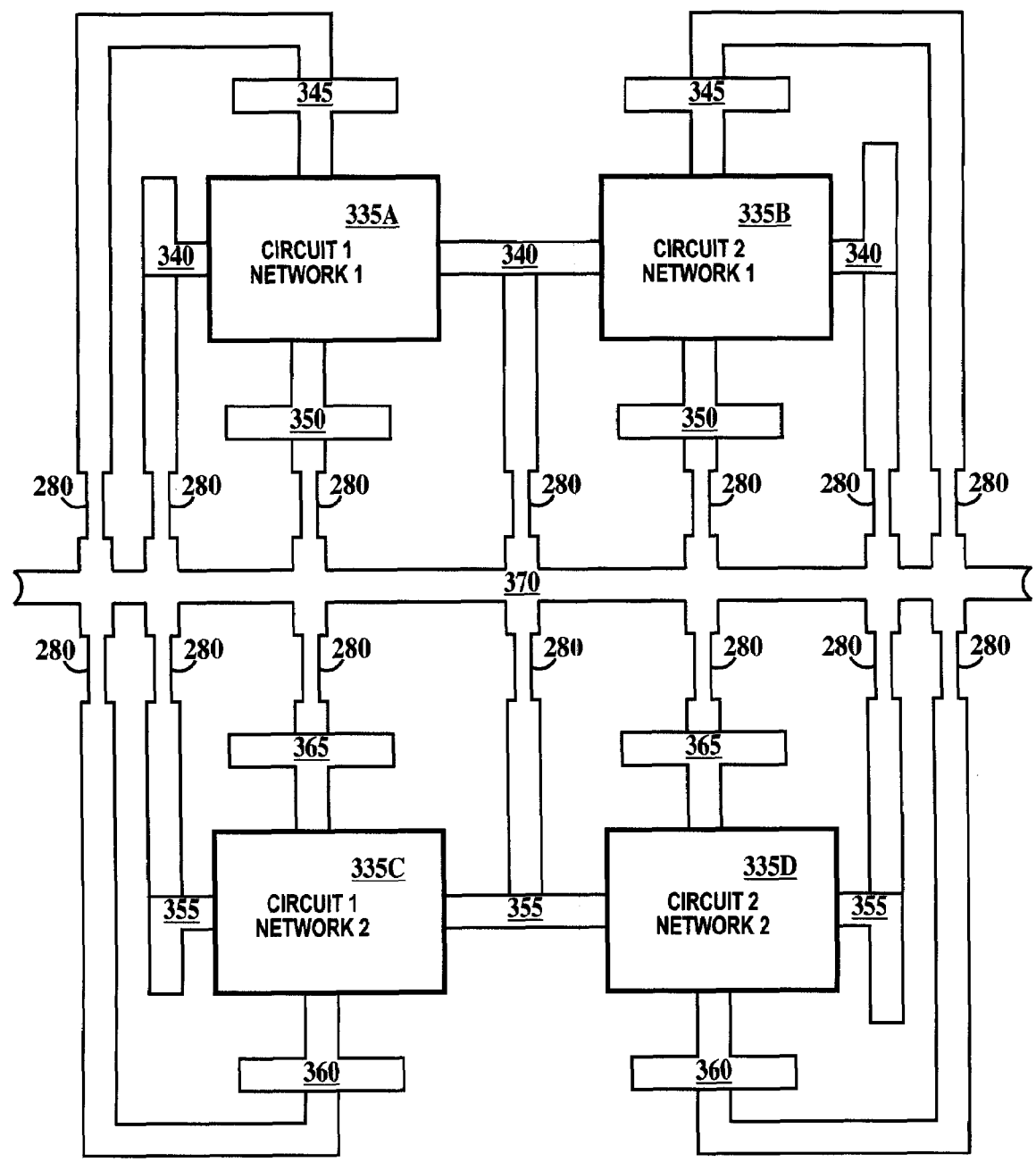
FIG. 8 is a exemplary layout of a portion of an integrated circuit chip according to a second embodiment of the present invention.

FIG. 8 is an exemplary layout of a portion of an integrated circuit chip according to a second embodiment of the present invention. While in a first embodiment of the present invention, the various data network, power distribution network and ground distribution network shorting fuses are placed in positions of opportunity selectable by a designer. In the second embodiment of the present invention places network, power distribution network and ground distribution network shorting fuses in predetermined locations more easily incorporated into an integrated circuit design when there are large numbers of fuses to place and large numbers of interconnections to be made.

In FIG. 8, circuits 335A and 335B are part of the same data network. Circuits 335A and 335B represent devices such as NFETs (not shown) and PFETs (not shown) wired together by wiring level M0 or M1 wires (not shown). Operational wiring level M1 wire segments 340 connect circuits 335A and 335B to each other and to other circuits in a first data network. Operational wiring level M1 power distribution network wire segments 345 connect to circuits 335A and 335B. Operational wiring level M1 ground distribution network wire segments 350 connect to circuits 335A and 335B. Wire segments 340, 345 and 350 connect to wires in wiring level M2 (not shown).

Circuits 335C and 335D represent devices such as NFETs (not shown) and PFETs (not shown) wired together by wiring level M0 or M1 wires (not shown). Operational wiring level M1 wire segments 355 connect circuits 335C and 335C to each other and to other circuits in a second data network. Operational wiring level M1 power distribution network wire segments 360 connect to circuits 335C and 335D. Operational wiring level M1 ground distribution network wire segments 365 connect to circuits 335C and 335D. Wire segments 355, 360 and 365 connect to wires in wiring level M2 (not shown). The power supply ultimately connected to power distribution network segments 345 may be a different power supply than that ultimately connected to power distribution network segments 365.

A wiring level M1 shorting bus 370 with integral fuses 280 is integrally (and thus electrically) connected (though shown as abutting for clarity) to wire segments 340, 345, 350, 355, 360 and 365. Thus, the various power distribution networks, ground distribution networks and data networks are tied together starting a wiring level M1 and are thus protected from process charge induced defects.

While FIG. 8 illustrates wiring level M1 fuses, the second embodiment of the present invention may be adapted to utilize metal silicide/polysilicon fuses 200 (see FIGS. 3A and 4A) connected to shorting 370 as described supra.

Figure 9:
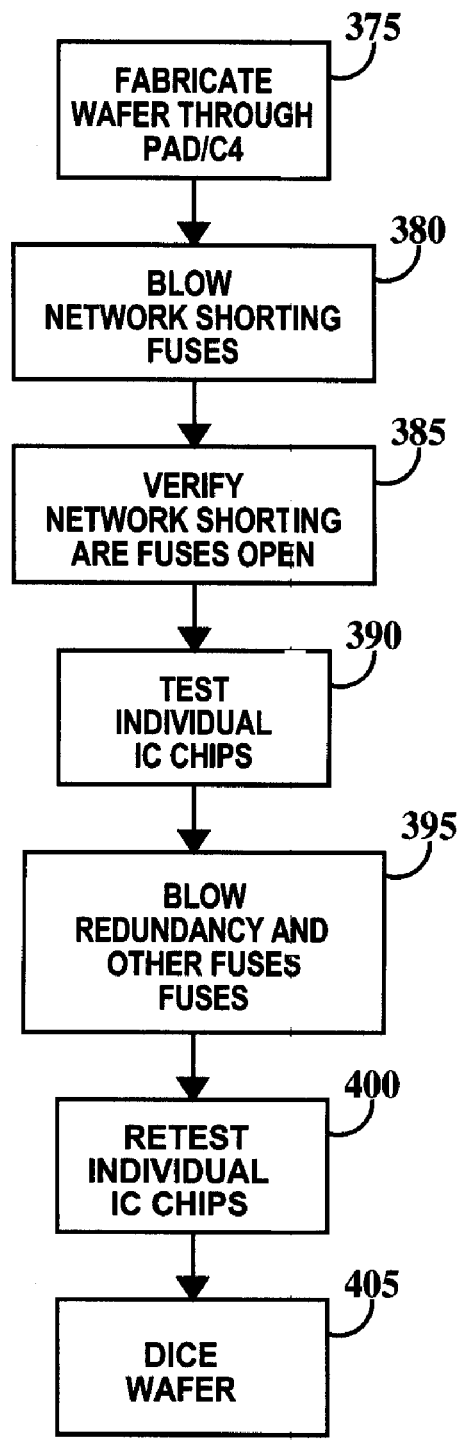
FIG. 9 is a flowchart of a method for fabricating an integrated circuit chip according to the present invention.

FIG. 9 is a flowchart of a method for fabricating an integrated circuit chip according to the present invention. In step 375, a wafer having integrated circuits having data networks, power distribution networks and ground distribution networks and shorting fuses according to the present invention is fabricated through terminal pads such as wire bond pad or C4 (solder bump) interconnects. In step 380, data network, power distribution network and ground distribution network shorting fuses are programmed (blown open). In optional step 385, it is verified that network, power distribution network and ground distribution network shorting fuses are open. In step 390, each individual integrated circuit chip is tested. In optional step 390, redundancy and other fuses are programmed (if present). In optional step 400, the integrated circuit chips that underwent fuse programming in step 390 are retested. Finally, in step 405, the wafer is diced to free the individual integrated circuit chips.

Steps 380 through 405 may be performed by the same test tool when network, power distribution network and ground distribution network shorting fuses are e-fuses.

In a third embodiment of the present invention the network shorting fuses are e-fuses that are narrow enough, thin enough or both narrow and thin enough that simply powering up the integrated chip prior to testing in step 390 will blow all or some of the network shorting fuses and steps 380 and 385 may be eliminated. In certain cases, where there is no voltage differential is applied across fuses during power up or normal operation of the integrated circuit, a tester may be programmed to apply a voltage differential across fuses to allow a current to flow across the fuse that will change the state of the fuses from a conductive state to an open state.

In a fourth embodiment the present invention, shorting fuses that short only the same ground distribution network or the same power distribution network may be left un-blown or replaced with wires.

Thus the present invention provides new and improved methods and structures to prevent charge induced yield loss during fabrication of integrated circuit chips.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of fabricating an integrated circuit, comprising:
   forming one or more power distribution networks;
   forming one or more ground distribution networks;
   forming one or more data networks;
   during said forming said one or more power distribution networks, said one or more ground distribution networks and said one or more data networks, temporarily and electrically connecting power wires, ground wires, data wires or combinations thereof of a same network or combinations of different networks together with fuses, said same network or said combinations of different networks selected from the group consisting of said one or more power distribution networks, said one or more ground distribution networks, said one or more data networks, and combinations thereof; and
   after completing said forming said one or more power distribution networks, said one or more ground distribution networks and said one or more data networks, performing a fuse-blow process of all said fuses, said fuse blow process permanently and electrically disconnecting said power wires, ground wires, data wires or combinations thereof of said same networks or said combinations of different networks previously connected by said fuses from each other.

2. The method of claim 1, wherein said fuses are selected from the group consisting of metal silicide-on-polysilicon fuses and metal fuses.

3. The method of claim 2, wherein said fuses are metal silicide-on-polysilicon fuses and further including:
   providing a semiconductor substrate; and
   connecting said power wires, ground wires, data wires or combinations thereof of said same network or said combination of different networks to said metal silicide/polysilicon fuses with wires in a first metal wiring level of said integrated circuit that is closest to said semiconductor substrate.

4. The method of claim 2, wherein said fuses are metal fuses and further including:
   providing a semiconductor substrate;
   forming said metal fuses in a first metal wiring level closest to said semiconductor substrate; and
   connecting said power wires, ground wires, data wires or combinations thereof of said same network or said combination of different networks to said metal fuses with wires in said first metal wiring level.

5. The method of claim 1, further including:
   providing a semiconductor substrate; and
   temporarily and electrically connecting said power wires, ground wires, data wires or combinations thereof of said same network or said combination of different networks together with said fuses with wires in a first metal wiring level closest to said semiconductor substrate.

6. A method of fabricating an integrated circuit, comprising:
   forming one or more power distribution networks;
   forming one or more ground distribution networks;
   forming one or more data networks;
   temporarily and electrically connecting power, ground or data wires of the same or different networks together with fuses, said same or different networks selected from the group consisting of said one or more power distribution networks, said one or more ground distribution networks, said one or more data networks, and combinations thereof; and
   forming a shorting bus; and
   temporarily and electrically connecting said power, ground or data wires of said same or different networks to said shorting bus.

7. The method of claim 6 wherein said fuses temporarily and electrically connect said power wires, ground wires, data wires or combinations thereof of said same network or said combination of different networks to said shorting bus.

8. The method of claim 1, further including providing a silicon-on-insulator (SOI) substrate.

9. A method of fabricating an integrated circuit, comprising:
   forming one or more power distribution networks, said one or more power distribution networks including power wires formed in a multiplicity of wiring levels;
   forming one or more ground distribution networks, said one or more ground distribution networks including ground wires formed in a multiplicity of wiring levels;
   forming one or more data networks, said one or more data networks including data wires formed in a multiplicity of wiring levels;
   during said forming said forming said one or more power distribution networks, said one or more ground distribution networks and said one or more data networks, temporarily and electrically connecting said power, ground, data wires or combinations thereof of a same network or combinations of different networks together in one or more of three wiring levels of said integrated circuit closet to said semiconductor substrate, said same network or said combinations of different networks selected from the group consisting of said one or more power distribution networks, said one or more ground distribution networks, said one or more data networks, and combinations thereof; and
   after completing said forming said one or more power distribution networks, said one or more ground distribution networks and said one or more data networks, permanently and electrically disconnecting all said power wires, ground wires, data wires or combinations thereof of said same networks or said combinations of different networks previously connected before said performing said one or more fabrication steps.

10. The method of claim 9, wherein said temporarily electrically connecting said power, ground or data wires of said same or different networks together comprises connecting said power wires, said ground wires, data wires or combinations thereof of said same network or said different networks together with fuses.

11. The method of claim 10, further including:

performing a fuse-blow process on all said fuses after forming terminal pads or solder bumps on said integrated circuit, said fuse blow process causing said permanent electrical disconnection of all said power wires, ground wires, data wires or combinations thereof of said same network or said different networks.

12. The method of claim 10, further including:

prior to testing said integrated circuit, applying a voltage differential across said fuses to change the state of each selected fuse from a conductive state to an open state.

13. The method of claim 11, wherein said fuses are selected from the group consisting of metal silicide on polysilicon fuses and metal fuses.

14. The method of claim 10, wherein said fuses are selected from the group consisting of metal silicide-on-polysilicon fuses and metal fuses.

15. The method of claim 14, wherein said fuses are metal silicide-on-polysilicon fuses and further including:

providing a semiconductor substrate; and connecting said power wires, ground wires, data wires or combinations thereof of said same network or said combination of different networks to said metal silicide/polysilicon fuses with wires in a first metal wiring level of said integrated circuit that is closest to said semiconductor substrate.

16. The method of claim 14, wherein said fuses are metal fuses and further including:

providing a semiconductor substrate;

forming said metal fuses in a first metal wiring level closest to said semiconductor substrate; and connecting said power wires, ground wires, data wires or combinations thereof of said same network or said combination of different networks to said metal fuses with wires in said first metal wiring level.

17. The method of claim 14, further including:

providing a semiconductor substrate; and temporarily and electrically connecting said power wires, ground wires, data wires or combinations thereof of said same network or said combination of different networks together with said fuses with wires in a first metal wiring level closest to said semiconductor substrate.

18. The method of claim 9, further including:

forming a shorting bus; and temporarily and electrically connecting said power wires, ground wires, data wires or combinations thereof of said same network or said combination of different networks to said shorting bus.

19. The method of claim 14, wherein said fuses temporarily and electrically connect said power wires, ground wires, data or combination thereof of said same network or said combination of different networks to said shorting bus.

20. The method of claim 1, further including:

forming a shorting bus; and temporarily and electrically connecting said power wires, ground wires, data wires or combinations thereof of said same network or said combination of different networks to said shorting bus.

* * * * *